(12) United States Patent
Matsushita et al.

(10) Patent No.: US 8,540,894 B2
(45) Date of Patent: Sep. 24, 2013

(54) POLISHING COMPOSITION

(75) Inventors: Takayuki Matsushita, Kyotanabe (JP);
Masashi Teramoto, Kyotanabe (JP);
Haruki Nojo, Tokyo (JP)

(73) Assignee: Nitta Haas Incorporated, Osaka (JP)

( * ) Notice: Subject to any disclaimer, the term of this patent is extended or adjusted under 35 U.S.C. 154(b) by 424 days.

(21) Appl. No.: 12/733,913

(22) PCT Filed: Sep. 29, 2008

(86) PCT No.: PCT/JP2008/067690
§ 371 (c)(1),
(2), (4) Date: Mar. 26, 2010

(87) PCT Pub. No.: WO2009/041697
PCT Pub. Date: Apr. 2, 2009

(65) Prior Publication Data
US 2010/0294983 A1    Nov. 25, 2010

(30) Foreign Application Priority Data
Sep. 28, 2007 (JP) ............................... P2007-256506

(51) Int. Cl.
*C09K 13/00* (2006.01)
(52) U.S. Cl.
USPC ......... 252/79.1; 252/79.5; 438/692; 438/693; 438/691; 438/690; 257/E21.23; 257/E21.304; 216/88; 216/89
(58) Field of Classification Search
USPC ............... 252/79.1, 79.5; 438/691, 692, 693, 438/690; 257/E21.23, E21.304; 216/88, 216/89
See application file for complete search history.

(56) References Cited

U.S. PATENT DOCUMENTS

| 2004/0142835 A1 | 7/2004 | Takashima |
| 2005/0054203 A1 | 3/2005 | Yamada |
| 2006/0096496 A1* | 5/2006 | Sun et al. ........................ 106/3 |
| 2008/0214006 A1* | 9/2008 | Lee et al. ...................... 438/692 |
| 2011/0121224 A1* | 5/2011 | Matsushita et al. .......... 252/79.1 |

FOREIGN PATENT DOCUMENTS

| JP | 10-245545 | 9/1998 |
| JP | 2001-110760 | 4/2001 |
| JP | 2002-114970 | 4/2002 |
| JP | 2002114970 A * | 4/2002 |
| JP | 2005-085858 | 3/2005 |
| JP | 2005-101479 A | 4/2005 |
| JP | 2008-251939 A | 10/2008 |
| WO | WO 2006/049912 | 5/2006 |

OTHER PUBLICATIONS

International Search Report for International application No. PCT/JP2008/067690 dated Jun. 17, 2010.
Office Action for corresponding Chinese patent application No. 2008801092751 dated Apr. 18, 2012 with English translation.
International Search Report for International application No. PCT/JP2008/067690 dated Nov. 18, 2008.
Japanese Office Action dated Mar. 26, 2013 for Japanese Application No. 2009534460 (with English translation).

* cited by examiner

*Primary Examiner* — Lan Vinh
*Assistant Examiner* — David Kaufman
(74) *Attorney, Agent, or Firm* — Harness, Dickey & Pierce, P.L.C.

(57) ABSTRACT

A polishing composition that can improve polishing property without foaming is provided. A polishing composition includes a pH regulator, a water-soluble polymer compound, and a compound containing an alkylene diamine structure having two nitrogens represented by the following general formula (1), and having at least one block type polyether bonded to the two nitrogens of the alkylene structure, the block type polyether having a bond of an oxyethylene group and an oxypropylene group:

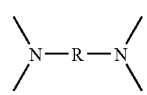

(1)

where R represents an alkylene group represented by $C_nH_{2n}$, in which n is an integer of 1 or more.

25 Claims, No Drawings

POLISHING COMPOSITION

PRIORITY STATEMENT

This application is the national phase under 35 U.S.C. §371 of PCT International Application No. PCT/JP2008/067690 which has an International filing date of Sep. 29, 2008, which designates the United States of America, and which claims priority on Japanese patent application number 2007-256506 filed Sep. 28, 2007, the entire contents of each of which are hereby incorporated herein by reference.

TECHNICAL FIELD

The present invention relates to a polishing composition used in polishing treatment of a silicon wafer.

BACKGROUND ART

Silicon wafer polishing by CMP achieves high accuracy flattening by conducting multistage polishing composed of three stages or four stages. Primary polishing and secondary polishing conducted in a first stage and a second stage have a main object to perform surface flattening, and requires high polishing rate.

Finish polishing conducted in a final state of a third stage or a fourth stage has a main object to suppress haze (surface fog). Specifically, in the finish polishing, processing pressure is decreased to suppress haze and additionally polishing and simultaneously hydrophilicization of a surface are conducted by changing a slurry composition from a composition used in the primary polishing and the secondary polishing.

Japanese Unexamined Patent Publication JP-A 10-245545 (1998) describes a polishing assistant suitable for mirror polishing of a silicon wafer surface. JP-A 2001-110760 describes a polishing assistant which suppresses haze of a silicon wafer surface and improves polishing performance such as surface flatness and polishing rate.

The polishing assistants described in JP-A 10-245545 (1998) and JP-A 2001-110760 comprise a block type polyether containing an oxyethylene group and an oxypropylene group, as shown in the respective general formula (1) described therein.

The polishing composition described in JP-A 2005-85858 contains a block type polyether containing an oxyethylene group and an oxypropylene group, silicon dioxide, a basic compound, at least one selected from hydroxyethyl cellulose and polyvinyl alcohol, and water, and improves COP and haze level.

The block type polyethers described in JP-A 10-245545, JP-A 2001-110760 and JP-A 2005-85858, and the hydroxyethyl cellulose and polyvinyl alcohol described in JP-A 2005-85858 have properties to adjust surface tension, and as a result, exhibit haze suppression effect and the like, but on the other hand, accelerate bubble formability.

Where the bubble formability is increased, for example, foaming is apt to be generated at dilution, and bubbles in a storage tank cause improper operation of a liquid level sensor. Therefore, it is preferable to prevent foaming as possible.

DISCLOSURE OF INVENTION

An object of the invention is to provide a polishing composition that can improve polishing property without foaming.

The invention provides a polishing composition comprising a pH regulator, a water-soluble polymer compound, and a compound containing an alkylene diamine structure having two nitrogens represented by the following general formula (1), and having at least one block type polyether bonded to the two nitrogens of the alkylene structure, the block type polyether having a bond of an oxyethylene group and an oxypropylene group, a content of the compound being within a range of from 0.0001 to 1% by weight based on a total weight of the polishing composition:

(1)

where R represents an alkylene group represented by $C_nH_{2n}$, in which n is an integer of 1 or more.

In the invention it is preferable that in the case where the block type polyether is bonded to only one nitrogen of the alkylene diamine structure, a carbon number n of the alkyl group R in the alkylene diamine structure satisfies the following formula (2), and in the case where the block type polyether is bonded to two nitrogens of the alkylene diamine structure, the carbon number n of the alkyl group R in the alkylene diamine structure satisfies the following formula (3):

$$1 \leq n \leq 2a+2b \quad (2)$$

$$1 \leq n \leq 2\times(2a+2b) \quad (3)$$

where a represents a number of the oxyethylene group in the block type polyether and b represents a number of the oxypropylene group therein.

In the invention, it is preferable that in the compound the number a of the oxyethylene group in the block type polyether is within a range of from 1 to 500, and the number b of the oxypropylene group therein is within a range of from 1 to 200.

In the invention, it is preferable that in the compound, a mass ratio between the oxyethylene group and the oxypropylene group in the block type polyether is within a range of from 10:90 to 95:5.

In the invention, it is preferable that the water-soluble polymer compound is water-soluble polysaccharides or polyvinyl alcohols. Further, in the invention, it is preferable that the polishing composition comprises abrasive grains.

BEST MODE FOR CARRYING OUT THE INVENTION

Preferred embodiments of the invention are described in detail below.

The polishing composition of the invention is directed to a polishing composition comprising a pH regulator, a water-soluble polymer compound, and a compound (hereinafter referred to as a "polishing assistant") containing an alkylene diamine structure having two nitrogens represented by the following formula (1), and having at least one block type polyether bonded to the two nitrogens of the alkylene diamine structure, the block type polyether having a bond of an oxyethylene group (hereinafter referred to as "EO") and an oxypropylene group (hereinafter referred to as "PO"):

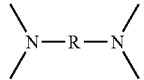  (1)

where R represents an alkylene group represented by $C_nH_{2n}$, in which n is an integer of 1 or more.

By containing such a polishing assistant, the polishing composition of the invention decreases a contact angle to a silicon wafer surface and a surface tension, thereby suppressing foaming of the polishing composition, and additionally can improve surface properties particularly after polishing, such as LPD (light point defects) and haze (surface fog).

The polishing composition of the invention is described in detail below.

The polishing assistant has, on its structure, an alkylene diamine structure as a basic skeleton, and a block type polyether, end has both defoamability due to the alkylene diamine structure and an effect of improving polishing characteristics due to the block type polyether.

In order to exhibit the effects due to such two main structures in good balance, it is important that the carbon number of an alkyl group of the alkylene diamine structure has good relationship with the number of the oxyethylene group EO and the number of the oxypropylene group PO in the block type polyether.

In the polishing assistant of the invention, it is preferable that in the case where the block type polyether is bonded to only one nitrogen of the alkylene diamine structure, the following formula (2) is satisfied, and in the case where the block type polyether is bonded to two nitrogens of the alkylene diamine structure, the following formula (3) is satisfied:

$$1 \leq n \leq 2a+2b \quad (2)$$

$$1 \leq n \leq 2 \times (2a+2b) \quad (3)$$

where n represents the carbon number of the alkyl group R in the alkylene diamine structure, a represents a number of the oxyethylene group in the block type polyether, and b represents a number of the oxypropylene group therein.

Defoamability and the effect of improving polishing characteristics can be exhibited in good balance by adjusting the carbon number of an alkylene group, the number of the oxyethylene group EO and the number of the oxypropylene group PO to such ranges.

In order that the polishing assistant exhibits those effects, it is preferable that the block type polyether contains at least one ether group selected from ether groups represented by the following general formulae (4) to (7):

 (4)

 (5)

 (6)

 (7)

where a and b each are an integer of 1 or more.

The number a of the oxyethylene group contained in an ether group is from 1 to 500, and preferably from 1 to 200. The number b of the oxypropylene group contained in an ether group is from 1 to 200, and preferably from 1 to 50. In the case that a exceeds 500 and in the case that b exceeds 200, the polishing assistant is difficult to be adsorbed on the surface of a silicon wafer due to steric hindrance of a block type polyether moiety, and this possibly results in aggregation of abrasive grains.

The mass ratio EO:PO between the oxyethylene group EO and the oxypropylene group PO in the block type polyether is preferably within a rang of from 10:90 to 95:5. More preferably, the mass of the oxypropylene group PO is larger than the mass of the oxyethylene group EO, namely, (mass of PO)> (mass of EO). Particularly preferably, the ratio EO:PO is within a range of from 10:90 to 40:60.

When the block type polyether of the polishing assistant is satisfied with such a range, an effect of further improving polishing characteristics is exhibited.

The polishing assistant that did not adsorb on a surface of a material to be polished functions as a coating material of a metal surface, and can prevent metal contamination to the surface of a material to be polished. For example, a stainless steel (SUS) is used in a holding member of a material to be polished. A metal component such as chromium, nickel and iron from the SUS member elutes in the polishing composition, resulting in contamination of a surface of a wafer as a material to be polished. When the polishing assistant is present, the surface of the stainless steel is coated with the polishing assistant, and this can suppress elution of a metal component in the polishing composition.

Prevention of metal contamination to a material to be polished can be achieved by the action of such a polishing assistant.

The content of the polishing assistant in the polishing composition of the invention is within a range of from 0.00001 to 10% by weight, and preferably from 0.0001 to 1% by weight, based on the total weight of the polishing composition. Where the content of the polishing assistant is less than 0.00001% by weight, sufficient improvement in polishing characteristics and defoamability are not obtained. Up to about 1% by weight of the content, the surface after polishing decreases LPD by hydrophilicization with the water-soluble polymer compound, and where the content is further increased, the polishing assistant adheres to the surface after polishing, thereby making the surface water repellent. However, LPD can be decreased by the surface coating effect with the polishing assistant. Where the content exceeds 10% by weight, the content is excessive, resulting in occurrence of aggregation and precipitation of particles.

The water-soluble polymer compound contained in the polishing composition of the invention is water-soluble polysaccharides or polyvinyl alcohols.

Nonionic hydroxymethyl cellulose and hydroxylethyl cellulose (HEC) are preferable as the water-soluble polysaccharides. The polysaccharides have a weight-average molecular weight of preferably smaller than 3,000,000, and more preferably from 900,000 to 1,500,000.

Where the molecular weight of the water-soluble polysaccharides is too small, hydrophilicization of a surface of a material to be polished is not exhibited, and on the other hand, where it is too large, aggregation of the polysaccharides occurs.

The content of the water-soluble polymer compound in the polishing composition of the invention is from 0.01 to 3% by weight based on the total weight of the polishing composition.

Examples of the pH regulator contained in the polishing composition of the invention include hydroxides of an alkali metal and an alkaline earth metal, such as potassium hydroxide (KOH), calcium hydroxide and sodium hydroxide, and carbonates thereof.

A pH of the polishing composition of the invention is adjusted using such a pH regulator. The pH is alkaline, and is a range of from 8 to 12, and preferably from 9 to 11.

The polishing composition of the invention exhibits sufficient effect even though abrasive grains are not contained. However, abrasive grains may be contained in a range that the preferable characteristics of the invention are not impaired.

For example, in the case that the polishing composition is used for the polishing requiring a polishing rate, such as a secondary polishing, it is preferable that abrasive grains are contained, and in the case that the polishing composition is used for the polishing requiring improvement of characteristics in a surface state rather than a polishing rate, like a final polishing, it is preferable that abrasive grains are not contained.

The abrasive grains can use any materials commonly used in this field, and examples thereof include colloidal silica, fumed silica, colloidal alumina, fumed alumina and ceria.

The content of the abrasive grains in the polishing composition of the invention is, for example, in a range of from 0.01 to 15% by weight based on the total weight of the polishing composition.

The polishing composition of the invention can contain one or two or more of various additives conventionally used in the polishing composition of this field in a range that the preferable characteristics of the polishing composition of the invention are not impaired.

Water used in the polishing composition of the invention is not particularly limited. However, considering use in a production step of a semiconductor device and the like, for example, pure water, ultrapure water, ion-exchanged water, distilled water and the like are preferable.

The polishing composition of the invention is produced by, for example, the following steps.

In the case that the polishing composition does not contain abrasive grains and consists of a polishing assistant, a water-soluble polymer compound, a pH regulator and other additives, the polishing composition can be produced by using those compounds in appropriate amounts, respectively, and water in an amount such that the total amount is 100% by weight, and uniformly dissolving or dispersing those components in water according to the general procedures so as to obtain a desired pH.

In the case of containing abrasive grains, a dispersion of abrasive grains is separately prepared, and the dispersion is mixed so as to obtain a give concentration of abrasive grains.

As other embodiment of the invention, the polishing composition can be used as a rinsing liquid. In particular, in the case that the polishing composition is used as a rinsing liquid at polishing finish, the polishing composition does not contain abrasive grains and a pH regulator. That is, a composition containing a polishing assistant and a water-soluble polymer compound is preferable.

EXAMPLES

Examples and Comparative Examples of the invention are described below.

Examples and Comparative Examples of the invention were prepared with the following compositions, respectively.

Example 1

| | |
|---|---|
| Abrasive grains: Silica particles | 10% by weight |
| Polishing assistant: compound represented by the following general formula (8) | 0.05% by weight |
| Water-soluble polymer: HEC | 0.3% by weight |
| pH regulator: Ammonia (29 wt % aqueous solution) | 1% by weight |

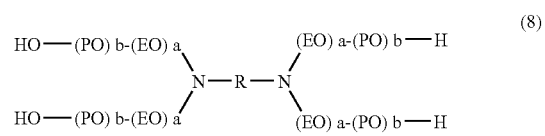

(8)

Where R represents an ethylene group represented by $C_2H_4$ (n=2), the number a of the oxyethylene group EO is 16, and the number b of the oxypropylene group is 19. Furthermore, the molecular weight is 7,240, and the mass ratio between the oxyethylene group EO and the oxypropylene group PO is EO:PO=40:60.

Example 2

| | |
|---|---|
| Abrasive grains: Silica particles | 10% by weight |
| Polishing assistant: Compound represented by the following general formula (9) | 0.05% by weight |
| Water-soluble polymer: HEC | 0.3% by weight |
| pH regulator: Ammonia (29 wt % aqueous solution) | 1% by weight |

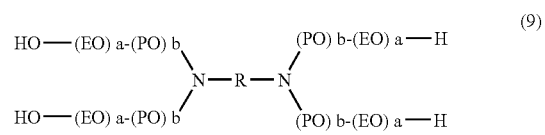

(9)

Where R represents an ethylene group represented by $C_2H_4$ (n=2), the number a of the oxyethylene group EO is 4, and the number b of the oxypropylene group PO is 26. Furthermore, the molecular weight is 6,800, and the mass ratio between the oxyethylene group EO and the oxypropylene group PO is EO:PO=10:90.

Example 3

| | |
|---|---|
| Abrasive grains: Silica particles | 10% by weight |
| Polishing assistant: Compound represented by the above general formula (9) | 0.05% by weight |

-continued

| | |
|---|---|
| Water-soluble polymer: HEC | 0.3% by weight |
| pH regulator: Ammonia (29 wt % aqueous solution) | 1% by weight |

Where R represents an ethylene group represented by $C_2H_4$ (n=2), the number a of the oxyethylene group EO is 15, and the number b of the oxypropylene group PO is 17. Furthermore, the molecular weight is 6,700, and the mass ratio between the oxyethylene group EO and the oxypropylene group PO is EO:PO=40:60.

Example 4

| | |
|---|---|
| Abrasive grains: Silica particles | 10% by weight |
| Polishing assistant: Compound represented by the above general formula (9) | 0.05% by weight |
| Water-soluble polymer: HEC | 0.3% by weight |
| pH regulator: Ammonia (29 wt % aqueous solution) | 1% by weight |

Where R represents an ethylene group represented by $C_2H_4$ (n=2), the number a of the oxyethylene group EO is 113, and the number b of the oxypropylene group PO is 22. Furthermore, the molecular weight is 25,000, and the mass ratio between the oxyethylene group EO and the oxypropylene group PO is EO:PO=80:20.

Example 5

| | |
|---|---|
| Abrasive grains: Silica particles | 10% by weight |
| Polishing assistant: Compound represented by the following general formula (10) | 0.05% by weight |
| Water-soluble polymer: HEC | 0.3% by weight |
| pH regulator: ammonia (29 wt % aqueous solution) | 1% by weight |

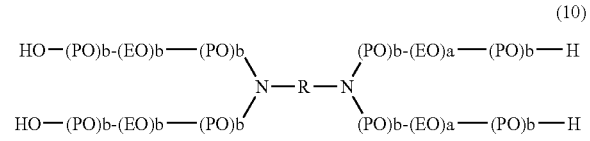  (10)

Where R represents an ethylene group represented by $C_2H_4$ (n=2), the number a of the oxyethylene group EO is 9, and the number b of the oxypropylene group is 7. Furthermore, the molecular weight is 5,000, and the mass ratio between the oxyethylene group EO and the oxypropylene group PO is EO:PO=32:68.

Comparative Example 1

| | |
|---|---|
| Abrasive grains: Silica particles | 10% by weight |
| Water-soluble polymer: HEC | 0.3% by weight |
| pH regulator: Ammonia (29 wt % aqueous solution) | 1% by weight |

Comparative Example 2

| | |
|---|---|
| Abrasive grains: Silica particles | 10% by weight |
| Polishing assistant: Compound represented by the following general formula (11) | 0.05% by weight |
| Water-soluble polymer: HEC | 0.3% by weight |
| pH regulator: Ammonia (29 wt % aqueous solution) | 1% by weight |

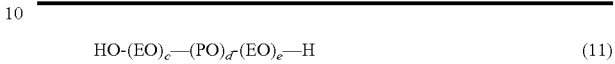  (11)

Where the number c of the oxyethylene group EO is 73, the number e is 73, and the number d of the oxypropylene group is 28.

Examples 1 and 2 use the polishing assistant of the invention, and use two kinds of assistants having different structures.

Comparative Example 1 is the same as Examples 1 and 2, except that a polishing assistant is not contained. Comparative Example 2 is the same as Examples 1 and 2, except that the assistant comprising the conventional block type polyether was used as a polishing assistant.

[Polishing Test]

Polishing test was conducted under the following conditions using Examples 1 and 2 and Comparative Examples 1 and 2 that were diluted 20 times, respectively, and LPD and haze value were evaluated. The results are shown in Table 1.

Substrate to be polished: 8 inches silicon wafer
Polishing apparatus: Strasbaugh single-sided polishing machine
Polishing pad: SUPREME RN-H (manufactured by Nitta Haas Incorporated)
Rotation speed of polishing disk: 115 rpm
Rotation speed of carrier: 100 rpm
Polishing load surface pressure: 100 gf/cm$^2$
Flow rate of polishing composition: 300 ml/min
Polishing time: 5 min LPD and haze value were measured using a wafer surface inspection apparatus (LS6600, manufactured by Hitachi Electronics Engineering Co., Ltd.) LPD was measured for particles having a particle diameter of 60 nm or larger.

The bubble formability was visually evaluated.

TABLE 1

| | Bubble formability | LPD | Haze value |
|---|---|---|---|
| Example 1 | Small | 32 counts | 0.038 ppm |
| Example 2 | Small | 32 counts | 0.038 ppm |
| Example 3 | Small | 32 counts | 0.035 ppm |
| Example 4 | Small | 74 counts | 0.037 ppm |
| Example 5 | Small | 89 counts | 0.035 ppm |
| Comparative Example 1 | Large | 262 counts | 0.047 ppm |
| Comparative Example 2 | Large | 58 counts | 0.035 ppm |

Comparative Example 1 does not contain a polishing assistant. Therefore, the result of each surface characteristic of LPD and haze value was all poor. Furthermore, because of containing HEC, large foaming was observed.

Comparative Example 2 contains a polishing assistant comprising the conventional block type polyether. As a result, the surface characteristics were improved, but bubble formability was poor and foaming of the same level as in Comparative Example 1 was seen.

In Examples 1 to 3, regarding surface characteristics, LPD was further improved as compared with Comparative Example 2, but the haze value was the same level as in Comparative Example 2. However, regarding bubble formability, foaming was hardly generated. Thus, it was seen that Examples 1 to 3 are excellent.

In Examples 4 and 5, regarding surface characteristics, LPD and haze value were further improved as compared with Comparative Example 1, and the surface characteristics were the same level as compared with Comparative Example 2. However, it was seen that Examples 4 and 5 are excellent regarding bubble formability.

Regarding Examples 1 to 5 and Comparative Example 2, contact angle and surface tension measurements and shaking test were further conducted. The results are shown in Table 2.

[Measurement of Liquid-Solid Contact Angle (θ)]

The liquid-solid contact angle (θ) between silicon wafers surface-treated in Examples 1 and 2 and Comparative Example 2 and the polishing composition was measured.

The liquid-solid contact angle means an angle formed by a liquid surface and a solid surface when a liquid (polishing composition) contacts with the solid surface (silicon wafer surface). The smaller the contact angle is, wettability of solid surface by a liquid is good. In the case of using water as a liquid, the solid surface is hydrophilic.

Using the polishing compositions of Examples 1 and 2 and Comparative Example 2, about 1 ml of each of the polishing compositions was dropped on a silicon wafer surface from which a natural oxide film had been removed by fluorine acid or the like, and an contact angle (θ) was measured with a full automatic contact angle meter (trade name: DM500, manufactured by Kyowa Interface Science Co., Ltd.) The polishing conditions are the same as above.

[Measurement of Surface Tension]

Measurement of surface tension was conducted on Examples 1 and 2 and Comparative Example 2. The surface tension is one kind of interface tension, and is generally expressed as surface tension of a liquid in the case of tension at a gas-liquid interface. The surface tension was measured using a full automatic contact angle meter (trade name: DM500, manufactured by Kyowa Interface Science Co., Ltd.) by a pendant drop method.

[Shaking Test]

The shaking test was conducted as follows. In a 50 ml sample tube, 20 ml of each polishing composition was placed, the sample tube was set to a vertical shaking machine (KM. Shaker V-SX, manufactured by Iwaki Sangyo Kabushiki Kaisha), and shaking was conducted at a shaking speed of 310 spm and a shaking stroke of 40 mm for 1 minute. After completion of the shaking, the sample tube was allowed to stand for 1 minute, and height of bubbles from a liquid level was measured.

TABLE 2

|  | Contact angle | Surface tension | Height of bubble |
|---|---|---|---|
| Example 1 | 66.4° | 42.7 mN/m | 4 mm |
| Example 2 | 51.3° | 32.6 mN/m | 0 mm |
| Example 3 | 63.0° | 38.7 mN/m | 4 mm |
| Example 4 | 74.5° | 45.0 mN/m | 8 mm |
| Example 5 | 66.7° | 39.2 mN/m | 6 mm |
| Comparative Example 2 | 75.6° | 48.2 mN/m | 14 mm |

Examples 1 to 5 can sufficiently suppress foaming due to shaking, and this is apparent from the fact that the contact angle and the value of surface tension are small.

Comparative Example 2 has the large contact angle and the large value of surface tension, and large foaming was seen.

Consideration of an effect of suppressing metal elution was further conducted on Example 1 and Comparative Examples 1 and 2. The results are shown in Table 3.

[Effect of Suppressing Metal Elution]

Consideration on an effect of suppressing metal elution was conducted as follows. In a 250 ml container, 250 ml of each polishing composition was placed, and metallic bodies (3 mm long, 3 mm wide, and 3 mm high) of chromium (Cr), iron (Fe) and nickel (Ni) were further added thereto. The container was set to a horizontal shaking machine (MMS-3010, manufactured by Tokyo Rikakikai Co., Ltd.) and whirl shaking was conducted at a whirl shaking speed of 100 rpm for 48 hours.

After the shaking, the metallic bodies were removed, and metal concentrations in each polishing composition were measured with ICP mass spectrometer (Agilent 7500, manufactured by Agilent Technologies).

TABLE 3

|  | Cr | Fe | Ni |
|---|---|---|---|
| Example 1 | <5 ppb | <10 ppb | <1 ppb |
| Comparative Example 1 | <5 ppb | <10 ppb | 4.2 ppb |
| Comparative Example 2 | <5 ppb | <10 ppb | 8.1 ppb |

In Comparative Examples 1 and 2, Cr and Fe were hardly detected. However, it was confirmed that Ni elutes in the polishing composition.

In Example 1, Cr, Fe and Ni all were not detected. Thus, it was confirmed that Example 1 has the effect of suppressing elution of a metal component such as stainless steel used in a holding member of a material to be polished.

In Comparative Example 2 having the polishing assistant consisting of the conventional block type polyether and Example 1 having the polishing composition of the invention, different effects were obtained in the elution of certain metals. This suggests that the function effect to a metal surface by polishing assistants contained in those polishing compositions differs. In other words, in the polishing assistant of the invention, the alkylene diamine structure moiety is first adsorbed on a target metal surface. Next, the block type structure moieties bonded to nitrogen moieties of the alkylene diamine structure unite the polishing assistants of the invention each other by an interaction. As a result of those, it is assumed that a strong surface protective film is formed on the target metal surface, and the film suppresses elution of a metal element.

On the other hand, in the polishing assistant according to Comparative Example 2, the polishing assistant does not have a site that directly adsorbs on a target metal surface (such as Ni), or even though the assistant adsorbed thereon, strong bonding is not generated. As a result, it is assumed that elution of a metal element could not be suppressed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, a polishing composition comprises a pH regulator, a water-soluble polymer compound, and a compound containing an alkylene diamine structure having two nitrogens represented by the following formula (1), and having at least one block type polyether bonded to two nitrogens of the alkylene structure, the block type polyether having a bond of an oxyethylene group and an oxypropylene group, and a content of the compound is within a range of from 0.0001 to 1% by weight based on a total weight of the polishing composition:

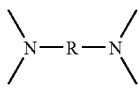

(1)

where R represents an alkylene group represented by $C_nH_{2n}$, in which n is an integer of 1 or more.

By containing such a compound, foaming of the polishing composition is suppressed by defoamability, and additionally surface properties particularly after polishing, such as LPD (light point defects) and haze (surface fog), can be improved.

Further, according to the invention, in the case where the block type polyether ether is bonded to only one nitrogen of the alkylene diamine structure, the following formula (2) is satisfied, and in the case where the block type polyether is bonded to two nitrogens of the alkylene diamine structure, the following formula (3) is satisfied:

$1 \leq n \leq 2a+2b$ (2)

$1 \leq n \leq 2 \times (2a+2b)$ (3)

where n represents the carbon number of the alkylene group R of the alkylene diamine structure, a represents the number of the oxyethylene group of the block type polyether, and b represents the number of the oxypropylene group of the block type polyether.

Defoamability due to the alkylene diamine structure and the effect of improving polishing characteristics due to the block type polyether can be exhibited in good balance by adjusting the carbon number of an alkylene group, the number of the oxyethylene group and the number of the oxypropylene group to such ranges.

Furthermore, according to the invention, in the compound, the number a of the oxyethylene group in the block type polyether is within a range of from 1 to 500, and the number b of the oxypropylene group therein is within a range of from 1 to 200.

Furthermore, according to the invention, in the compound, a mass ratio between the oxyethylene group and oxypropylene group in the block type polyether is within a range of from 10:90 to 95:5.

The effect of further improving polishing characteristics is exhibited by that the block type polyether of the compound satisfies such ranges.

Furthermore, according to the invention, water-soluble polysaccharides or polyvinyl alcohols can be used as the water-soluble polymer compound.

Furthermore, according to the invention, it is preferable that the polishing composition comprises abrasive grains in the case of using in the polishing requiring a polishing rate, such as secondary polishing.

The invention claimed is:

1. A polishing composition, consisting essentially of:
a pH regulator, a water-soluble polymer compound, and a compound containing an alkylene diamine structure having two nitrogens represented by the following general formula (1), and having at least one block type polyether bonded to at least one of the two nitrogens of the alkylene structure, the block type polyether having a bond of an oxyethylene group and an oxypropylene group,
a content of the compound being within a range of from 0.0001 to 1% by weight based on a total weight of the polishing composition,

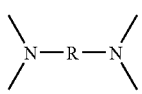

(1)

where R represents an alkylene group represented by $C_nH_{2n}$, in which n is an integer of 1 or more.

2. The polishing composition of claim 1, wherein the at least one block type polyether is bonded to only one nitrogen of the alkylene diamine structure, and
a carbon number n of the alkyl group R in the alkylene diamine structure satisfies the following formula (2), $1 \leq n \leq 2a+2b$ (2)

where a represents a number of the oxyethylene group in the block type polyether and b represents a number of the oxypropylene group therein.

3. The polishing composition of claim 2, wherein in the compound the number a of the oxyethylene group in the block type polyether is within a range of from 1 to 500, and the number b of the oxypropylene group therein is within a range of from 1 to 200.

4. The polishing composition of claim 1, wherein in the compound, a mass ratio between the oxyethylene group and the oxypropylene group in the block type polyether is within a range of from 10:90 to 95:5.

5. The polishing composition of claim 1, wherein the water-soluble polymer compound is water-soluble polysaccharides or polyvinyl alcohols.

6. The polishing composition of claim 1, further comprising abrasive grains.

7. The polishing composition of claim 2, wherein in the compound, a mass ratio between the oxyethylene group and the oxypropylene group in the block type polyether is within a range of from 10:90 to 95:5.

8. The polishing composition of claim 3, wherein in the compound, a mass ratio between the oxyethylene group and the oxypropylene group in the block type polyether is within a range of from 10:90 to 95:5.

9. The polishing composition of claim 2, wherein the water-soluble polymer compound is water-soluble polysaccharides or polyvinyl alcohols.

10. The polishing composition of claim 3, wherein the water-soluble polymer compound is water-soluble polysaccharides or polyvinyl alcohols.

11. The polishing composition of claim 4, wherein the water-soluble polymer compound is water-soluble polysaccharides or polyvinyl alcohols.

12. The polishing composition of claim 7, wherein the water-soluble polymer compound is water-soluble polysaccharides or polyvinyl alcohols.

13. The polishing composition of claim 8, wherein the water-soluble polymer compound is water-soluble polysaccharides or polyvinyl alcohols.

14. The polishing composition of claim 2, further comprising abrasive grains.

15. The polishing composition of claim 3, further comprising abrasive grains.

16. The polishing composition of claim 4, further comprising abrasive grains.

17. The polishing composition of claim 5, further comprising abrasive grains.

18. The polishing composition of claim 7, further comprising abrasive grains.

19. The polishing composition of claim 8, further comprising abrasive grains.

20. The polishing composition of claim 9, further comprising abrasive grains.

21. The polishing composition of claim 10, further comprising abrasive grains.

22. The polishing composition of claim 11, further comprising abrasive grains.

23. The polishing composition of claim 12, further comprising abrasive grains.

24. The polishing composition of claim 13, further comprising abrasive grains.

25. The polishing composition of claim 1, wherein at least one block type polyether is bonded to each of the two nitrogens of the alkylene diamine structure, and the carbon number n of the alkyl group R in the alkylene diamine structure satisfies the following formula (3), $$1 \leq n \leq 2 \times (2a+2b) \qquad (3)$$

where a represents a number of the oxyethylene group in the block type polyether and b represents a number of the oxypropylene group therein.

* * * * *